(12) United States Patent
Hoffmann et al.

(10) Patent No.: US 6,982,380 B2
(45) Date of Patent: Jan. 3, 2006

(54) ENCAPSULATED COMPONENT WHICH IS SMALL IN TERMS OF HEIGHT AND METHOD FOR PRODUCING THE SAME

(75) Inventors: Christian Hoffmann, Deutschlandsberg (AT); Jürgen Portmann, München (DE); Hans Krueger, München (DE)

(73) Assignee: Epcos AG, Munich (DE)

( * ) Notice: Subject to any disclaimer, the term of this patent is extended or adjusted under 35 U.S.C. 154(b) by 26 days.

(21) Appl. No.: 10/500,371

(22) PCT Filed: Dec. 11, 2002

(86) PCT No.: PCT/DE02/04535

§ 371 (c)(1),
(2), (4) Date: Oct. 8, 2004

(87) PCT Pub. No.: WO03/058810

PCT Pub. Date: Jul. 17, 2003

(65) Prior Publication Data

US 2005/0034888 A1 Feb. 17, 2005

(30) Foreign Application Priority Data

Dec. 28, 2001 (DE) .......................... 101 64 494

(51) Int. Cl.
H01L 23/28 (2006.01)
H05K 5/06 (2006.01)

(52) U.S. Cl. .................... 174/52.2; 174/52.4; 257/787; 257/738; 257/778

(58) Field of Classification Search ................ 174/52.2, 174/52.4; 257/787, 737, 738, 778
See application file for complete search history.

(56) References Cited

U.S. PATENT DOCUMENTS 5,739,585 A 4/1998 Akram et al.
5,850,688 A 12/1998 Ando et al.
6,137,062 A 10/2000 Zimmerman
6,446,316 B1 9/2002 Fürbacher et al.
6,722,030 B1 4/2004 Stelzl et al.
2001/0002163 A1 5/2001 Imasu et al.
2003/0047806 A1 3/2003 Stelzl et al.
2004/0058473 A1 3/2004 Feiertag et al.

FOREIGN PATENT DOCUMENTS

| DE | 198 06 818 | 11/1999 |
|---|---|---|
| EP | 0 759 231 | 12/1998 |
| EP | 0 896 427 | 2/1999 |
| EP | 1 069 616 | 1/2001 |
| WO | WO 01/78041 | 10/2001 |
| WO | WO 02/061833 | 8/2002 |

OTHER PUBLICATIONS

Abstract of Japanese Application 57–007611 Published Jan. 14, 1982, *Patent Abstracts of Japan*, vol. 006, No. 067, Apr. 28, 1982.

Abstract of Japanese Application 10–321666 Published Dec. 4, 1998, *Patent Abstracts of Japan*, vol. 1999, No. 3, Mar. 31, 1999.

Selmeier et al, "Recent Advances in SAW Packaging", *IEEE Ultrasonics Symposium*, Oct. 7–10, 2001, pp. 283–292.

*Primary Examiner*—Hung V. Ngo
(74) *Attorney, Agent, or Firm*—Schiff Hardin LLP

(57) ABSTRACT

For simpler and safer encapsulation of components, it is proposed to generate the connection between a chip and a carrier substrate by means of bump connections that are sunk into recesses on the carrier substrate. The component thereby lies directly on the carrier substrate, in particular on a frame circumscribing the component structures on the chip.

29 Claims, 5 Drawing Sheets

ENCAPSULATED COMPONENT WHICH IS SMALL IN TERMS OF HEIGHT AND METHOD FOR PRODUCING THE SAME

BACKGROUND OF THE INVENTION

The invention concerns an encapsulated component with a reduced overall height, in particular a component working with acoustic waves which is constructed on a piezoelectric substrate.

In electrical components, the trend increasingly goes towards components without massive housings. In order to nevertheless protect the components from environmental influences, various methods have already been proposed for simple encapsulation of the components. One possibility is to completely provide a component with a protective layer, for example to completely embed it in plastic, whereby only the electrical connections for the component are free of plastic. However, such an encapsulation is problematic for components that bear component structures on a surface that are sensitive to a direct embedding.

For example, for surface wave components it has already been proposed to cover the component structures arranged on the surface of a piezoelectric substrate with the aid of a simple cap, in particular a cap of plastic, before the component is further encapsulated. Such an encapsulation method used by the applicant under the name PROTEC and such an encapsulation method is, for example, known from EP 0 759 231 B1. Since such an integrated, producible cap for the component structures itself provides only a slight protection, it was, for example, proposed in DE 198 06 818 A to solder the component on a carrier in a flip-chip arrangement, and subsequently to cover it with a foil that seals tight with the carrier between the components. In further variations of such foil coverings of components, it is also proposed to further hermetically seal these foils via application of a metal layer over the foil and to, for example, galvanically reinforce this metallization. However, what is disadvantageous in this method is the elaborate lamination process for application of the foil as well as the wet-chemical or, respectively, galvanic metallization that can, given slight leakages of the foil covering, already lead to a penetration of moisture into the component structures.

SUMMARY OF THE INVENTION

It is therefore the object of the present invention to specify a component which comprises a simple but nevertheless hermetically sealed encapsulation, as well as a method for its production.

The invention proposes a component encapsulation, whereby the chip bearing the component structures is in fact likewise mounted on a carrier substrate according to the flip-chip technique with the aid of bump connections, in which the chip is, however, no longer arranged as before over the carrier substrate at a distance from it, but rather in which the surface of the chip inventively lies on the carrier substrate. This is achieved in the inventive component in that the bump connections are not directly arranged on the surface of the carrier substrate, but rather in recesses of a carrier substrate, such that they are in practice sunken bumps. On the floor of the recesses, solderable connection areas of the carrier substrate are provided that are electrically conductively connected via the bumps with corresponding solderable metallizations on the surface of the chip.

The solderable connection areas that are uncovered in the recesses of the upper layer are preferably applied on the surface of the lower layer of the (then at least) two-layer carrier substrate. The connection areas can thereby be connected with a wiring structure that ultimately leads to the external connections of the component, which preferably are arranged on the underside of the carrier substrate and are in particular fashioned SMD-capable.

In a single layer carrier substrate, however, the connection areas can also be formed by the connections surfaces fashioned SMD-capable (SMD pads) that, on the underside of the carrier substrate, seal over the recesses with the bump arranged therein.

In contrast to known encapsulated components, the inventive component has the advantage of a lower overall height because the distance between chip and carrier substrate is minimized, since the surface of the chip already lies on the carrier substrate.

The component has the further advantage that the position and relative arrangement of the bumps can be predetermined exactly with the aid of the recesses. In this manner it is possible to provide a compact and space-saving design of the component which is further improved in that bumps that exhibit a smaller cross-section area than before can be realized with the invention.

The placement of the chips has the further advantage that mechanical forces acting on the chip, as they can in particular ensue given thermal load, are better spread by the support surface, and the bump connections are thereby mechanically unburdened. The sizes of the bumps can also thereby be minimized since their mechanical support function is inventively minimized.

The placement of the chip surface on the carrier substrate furthermore has the advantage that a seal between chip and carrier substrate can already ensue via the placement. In any case, this leads to only a minimal gap between chip and carrier substrate that can be further sealed with simple means.

The inventive encapsulation is particularly advantageous for a component which works with acoustic waves and is, for example, fashioned as a SAW component (surface wave component), as an FBAR resonator, as a BAW resonator or as an SCF filter. These components have in common that the physical properties and in particular the center or resonance frequency of the components are influenced by mechanical forces that act on the piezoelectric substrate of the chip. The properties of these components also sensitively react to surface layers that are deposited over the component structures.

To prevent forces acting directly on the component structures of the chip, in a further embodiment the invention proposes to arrange the component structures in the component in a hollow space. For this, a frame is provided that is either attached to the surface of the chip or is attached to the surface of the carrier substrate facing the chip, said frame enclosing the component structures in the component and on which the respective counterpart —here thus the carrier substrate or the chip —overlies as a cover. The component structures arranged in the hollow formed from the frame and both facing surfaces of carrier substrate and chip surface are thereby protected from all sides.

The gap remaining via the bare placement of chip or carrier substrate on the frame is preferably sealed with a closed solder border orbiting the chip. With such a solder border, a good hermetically-sealing connection can be achieved, in particular to metallizations that are attached to the carrier substrate and the chip at the contact points for the solder border. In contrast to this, the frame on the carrier substrate or chip encloses a depression that geometrically defines the hollow for the component structures. It is also thereby ensured that the component structures remain arranged at an exact distance from the carrier substrate, and that a direct mechanical effect on component structures is safely prevented. The frame can thereby be raised above the surface of carrier substrate or chip. However, it is also possible that the frame is formed from the inner edge of a depression whose lower floor lies below the level of the remaining surface, and that forms the hollow for acceptance of the component structures.

As a raised structure, the frame is formed from plastic or a metallization and can be generated integrated with other components or structures of component or carrier substrate. In particular when the frame is fashioned as a metallization on the chip, it can be generated at least partially together with the remaining metallizations that constitute the component structures. A frame comprised of a metallization or provided with a metallization has the advantage that the metal surface, in particular when it comes in contact with a further metallization upon placement of the chip, constitutes a good seal of the contact surface or, respectively, of the gap remaining between carrier substrate and chip. The metallization also achieves good contact, bonding and wetting for the solder border, such that a hermetic seal of the entire component or, respectively, of the component structures within the hollow is ensured. However, it is also possible that both contact surfaces, thus the surface of the frame and the contact surface lying on the frame, are without additional covering. The contact surface on the carrier substrate can correspondingly be formed of the material of the upper layer; in contrast to this, the contact surface on the chip is formed of the substrate material. However, independent of this it is of advantage to provide a metallization in the outer region of the interstice between carrier substrate and chip with which the cited solder border can terminate at both parts.

The carrier substrate is preferably but not necessarily an at least two-layer multi-layer ceramic that can be a LTCC ceramic, an HTCC ceramic or a combination of HTCC or, respectively, LTCC and, as the case may be, further polymer layers. The ceramic can advantageously be effected as a low-shrinkage ceramic (non-shrinkage). Upon sintering, this guarantees only a slight dimension change, such that a geometry predetermined in a green film largely remains upon sintering, or at least in a reproducible manner suffers only a slight shrinking process due to sinter shrinkage. With LTCC ceramics, it is possible to provide the green films with cost-effective metallizations whose resistance to the low applied sinter temperatures of the LTCC ceramic is ensured.

However, it is also possible to effect the carrier substrate as a PCB that is fashioned on a plastic basis as a single-layer or multi-layer circuit board.

Independent of the material of the multi-layer carrier substrate, its individual layers are individually metallized, at least on the surfaces that lie inside in the multi-layer carrier substrate. Inlying feedthroughs can also be provided before the joining of the individual layers into the multi-layer substrate. The feedthroughs leading outwards to the surface of the multi-layer carrier substrate can be applied and metallized after merging of the individual layers. Given a suitable metallization acting as a mirror layer between the individual layers, this can also serve as a stop layer for a laser treatment with which a recess can be achieved to uncover this metallization. However, it is in fact also possible to already generate the feedthroughs in the form of recesses in the individual layers before the sintering. These can then advantageously first be filled with an auxiliary material that can be removed again in a simple manner after the sintering.

In a two-layer carrier substrate, it is thus only necessary to apply metallization traces lain between the first and second layer before the merging of the two layers. Feedthroughs leading to these metallizations can subsequently be provided in the form of recesses in which each metallization between the two layers is uncovered.

In particular for the recesses in which the connection areas are uncovered, it is of advantage when the diameter of the recesses is larger than the diameter of the solderable connection areas on the surface of the lower layer. Since the diameter of the solderable connection areas is applicably responsible for the diameter of the later bumps, in this manner a narrower bump diameter is enabled that can be arranged contact-free in the recess, thus that does not contact the walls of the recess. In order to realize such connection metallizations with limited diameter, feedthroughs arranged in the lower layer of the carrier substrate are preferably provided to define the solderable connection areas of the surface of the lower layer. Such a feedthrough filled with conductive material in the lower layer can, with its "surface", constitute the connection metallization in the recess of the upper layer. For this embodiment, the feedthrough is preferably filled in the lower layer with silver palladium which, for production of a solderable connection, can subsequently still be provided with a galvanic copper or copper-gold layer. This copper-gold layer can also be deposited without current. A nickel-gold layer is also suitable as a sealing layer, whereby in particular the deposited gold layer, which is fashioned thin, proves to be of particular advantage since it can be wetted well with solder and therefore enables an automatic structuring of solder connections, in particular of the bumps. Upon application of solder mass, this remains bonded only to those locations that show a good wetting capability with solder, thus in particular the areas provided with a thin gold coating.

The connection areas on the surface of the lower layer that are later uncovered in the recesses can also be rectangular, for example sections from band-shaped conductor traces. The recess can also be rectangular, and is likewise preferably of a larger diameter than the width of the conductor trace uncovered in the recess, with the conductor trace constituting the connection area.

The production of the bumps is attained with various methods, whereby the inventively proposed measure of the arrangement of bumps in recesses offers further possibilities for production of bumps that were previously unknown. In a conventional manner, the bumps can be generated via galvanic deposition over the connection areas, for example via deposition of SnPb, SnAg, SnCu, SnAgCu or SnAu. The galvanic deposition can be associated with a remelting, which leads to the formation of the corresponding alloy.

It is also possible to generate the bumps from solder paste in a conventional manner by means of silk screen or stencil printing, and subsequently to implement a reflow process in which the bumps attain their ball-shaped geometry. Specifically directed to the inventive embodiment of the connection areas in the recesses is a further method in which a solder paste is scraped, rolled or brushed into the recesses, and in that a reflow process is subsequently implemented. This method has the advantage that no structuring is necessary to produce the bumps since the deposition of solder ensues automatically within the recesses. A further inventive method variant that is exclusively possible with the inventive sinking of the bumps ensues via vibration of solder balls. The size of the solder balls is thereby predetermined and the bump size is thereby defined exactly.

Instead of a reflow soldering, a further possibility for production of the bumps is to implement a laser bumping in which the solder balls are melted via punctiform heating and are thereby generated at the desired location.

It is also possible to generate the bumps via punching of cylinders from solder foil over the recesses.

Alternatively, the bumps can also be generated on the solderable metallizations on the surface of the chip. This can, for example, likewise ensue via galvanic deposition over the corresponding metallizations. A stencil printing of solder depots on the metallizations and a subsequently remelting process is also possible. Since here the wetting capability of the solderable metallizations also makes the structuring easier, a different wetting capability of metallic structures can also be used for structuring of the bumps on the wafer or, respectively, on the chip. For example, it is possible to passivate the greater part of the metallizations located on the chip, for example via generation of an anodic oxide layer that can additionally be covered with an applied mineral layer, for example a thin silicon oxide layer or a thin silicon nitride layer. The surfaces not covered by this passivation then remain wettable with solder or are specifically made wettable via suitable further layers, what are known as under-bump metallizations —UBM —with solder, while the passivated surfaces of the metallization constitute the solder stop mask.

A production of the bumps on the surface of the chip by means of laser bumping is also possible.

In addition to the component structures and the solderable metallizations, still further metallizations that ease a sealing of the inventive component with the solder border are present on the surface of the chip. For this, the chip is provided with a metallization in the region of its lower edge, which is formed by the surface bearing the component structures and the face surface and that, in the component, faces the carrier substrate. This can simultaneously be generated with the solderable metallizations, for example with a sputter process. A layer sequence of titanium (for the improved bonding) and copper is thereby first generated. A sufficient thickness of this layer can already be achieved via sputtering, for example 100 to 200 nm of titanium and more than 6 μm of copper. However, it is also possible to generate a thin titanium/copper layer (1 to 2 μm copper) and to subsequently galvanically reinforce this. The copper layer can thereby be thickened to a layer of approximately 10 to 20 μm. The frame on the carrier substrate is then preferably in turn realized with a corresponding metallization, whereby a structuring of the frame is attained via structured sputtering with the aid of a photoresist mask. The mask can also be fashioned such that it can remain on the carrier substrate during the galvanic thickening process.

The frame is preferably structured such that the chip can lie on the frame in the region of its lower chip edge such that a frame area of the chip still remains uncovered. The metallization on the chip is thereby fashioned such that facing surfaces of the chip are preferably also metallized.

Advantageous compounds for application of a fluid solder are the compounds SnAg, SnAgCu, SnCuAg or SnAu. A high melting point alloy is preferably used to produce the solder border. This has the advantage that solder connections made from high melting point solder remain unchanged in the later processing steps upon soldering of the component, and neither soften nor otherwise change. It therewith leads neither to a warping of the solder connections nor to a shifting of the component with regard to its original state. This increases the lifespan of the component and prevents, in the further processing of the component, generating damages on the component via softening of solder locations.

In a further embodiment of the invention, the metallization provided for contact with the solder border is effected in the region of the lower chip edge and at least in a band-shaped region below the lower chip edge on the carrier substrate after the soldering of the chip. This can also ensue with a sputter process. In this case, it is possible to provide the entire back side of the chip with a metallization and to advantageously connect this with a connection on the carrier substrate. The frame, preferably fashioned from metal, can correspondingly also be connected both with the metallization on the back side of the chip and with ground. An electromagnetic shielding of the component is therewith arrived at.

As a further advantage, it appears that the frame connected with ground is preferably also suitable to dissipate pyrovoltages that, for example, can be generated during the production process and the temperature effects connected therewith on the piezoelectric substrate of the chip. The frame is also preferably connected with metallizations that are arranged near the component structures on the surface of the chip in open spaces on which such pyrocharges can only be created. It is also possible to structure the frame such that it mutually covers such open spaces. With these metallizations or the correspondingly structured frame in inactive open spaces, it is achieved to absorb pyroelectrically-generated charges and to dissipate them to the frame (and therewith to ground) without damage.

The dissipation of pyrocharges can furthermore be supported by the advantageous measure that the surface of the chip is roughened on the open spaces not taken by component structures. Via roughening and/or structuring of the surface of the chip, a discharge of the surface is provoked via flashovers on the frame that is located optimally near to the chip surface, and the open spaces are thereby discharged.

The roughening of the surface has the further advantage that metallizations attached thereto possess a better bonding. The roughening of the chip surface can thereby ensues via a beam process in which a particle stream is directed onto the chip. Sensitive areas of the chip surface, in particular the component structures, are thereby protected by a lacquer or a structured foil, since soft surfaces are not removed in the beam process. It is also possible to roughen the surface via a selective etching process that does not attack the sensitive structures, in particular the component structures, and only etches the material of the chip, thus the piezoelectric substrate. For this, for example, a field plasma can be used with which the component structures remain undamaged.

A metallization applied to the back side of the chip can serve in an inventive manner for production of an inscription of the component. For this, via this metallization a lacquer layer is applied that forms a color contrast with the metallization. Via laser writing, the lacquer layer is selectively removed and the writing effect is achieved. To produce a contrast effect, other auxiliary layers that can be lifted with lasers can also be generated over the metallization. For example, different metallization layers are also suitable insofar as they can form a contrary optical contrast. This contrast can also exist in different reflection effects of the metallization, or in a different metal color. For example, black nickel is particularly suitable as a contrast agent. This forms a good contrast with metallic reflective metallizations or with copper.

In the following, the invention and in particular the method for production of an inventive component are explained in detail using exemplary embodiments and associated schematic (and therefore not to scale) Figures.

DESCRIPTION OF THE PREFERRED EMBODIMENTS

Figure 1:
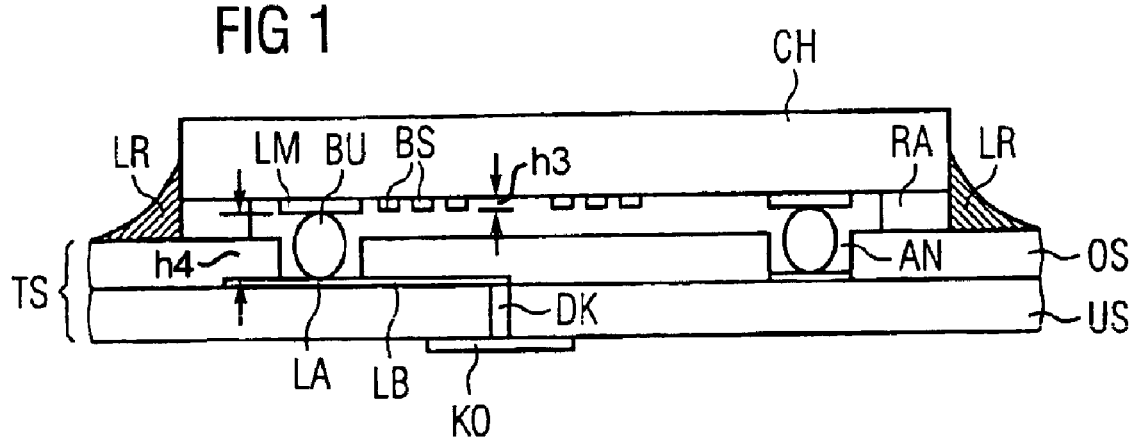
FIG. 1 shows an inventive component in schematic cross-section.

FIG. 1 shows a first embodiment of an inventive component in schematic cross-section. The component is essentially formed of the chip CH, for example a piezoelectric substrate on whose one surface are applied component structures BS such as, for example, band-shaped metallizations of a surface wave component (SAW component) and which have a height h3. The chip is applied on a carrier substrate TS which comprises at least one upper layer OS and one lower layer US.

Recesses AN, which have a depth h1, are provided in the upper layer OS of the carrier substrate TS. On the floor of the recesses, solderable connection areas LA are arranged over which the bump connections BU, which have a height h4, are arranged. The bumps BU connect the solderable connection areas LA with the solderable metallizations LM on the surface of the chip CH. The chip rests on a frame RA which defines the distance between the upper surface of the upper layer OS and the surface of the chip CH and prevents a direct contact of the component structures BS with the carrier substrate TS. In the direct contact with the lower chip edge and the adjacent surface areas of the carrier substrate, the entire chip is arranged surrounded by a solder border LR that seals the chip CH to the carrier substrate TS. Between upper layer OS and lower layer US, conductor traces LB are provided that can form a wiring plane. Further feedthroughs DK through the lower layer US or, as the case may be, further layers achieve an electrically-conductive connection to the electrical connections for the contacting of the component outwards, for example to the SMD-capable contacts KO on the underside of the carrier substrate.

Figure 2A:
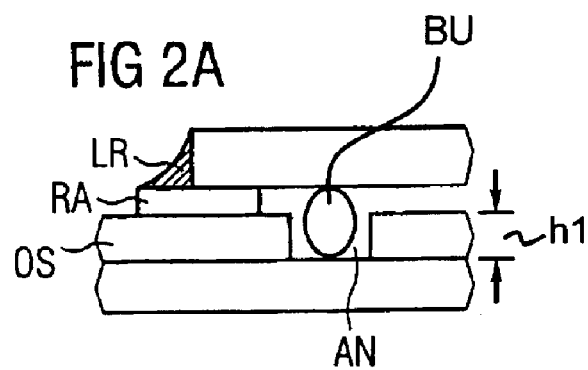
FIGS. 2A, 2B and 2C show various variants at portions of the component in schematic cross-section.
Figure 2B:
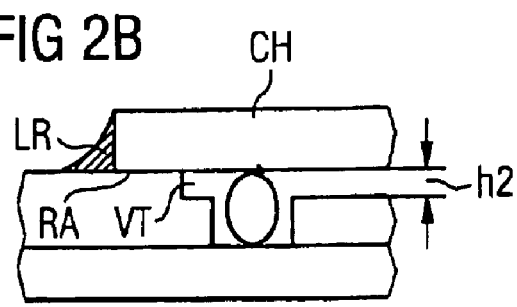
Figure 2C:
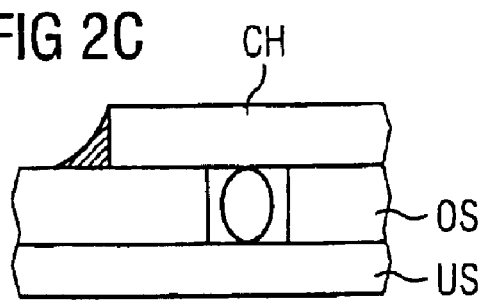

FIGS. 2A–2C show further variations of an inventive component that differs from the execution in FIG. 1 with regard to the arrangement of the frame.

FIG. 2A shows an arrangement in schematic cross-section in which the frame on the surface of the carrier substrate or, respectively, on its upper layer OS is dimensioned such that the chip is attached only to an inlying part of the frame RA. The solder border LR, which here hermetically seals not with the substrate but rather with the frame and the chip CH, is arranged over the uncovered region of the frame RA. The frame RA in turn hermetically seals with the carrier substrate.

FIG. 2B shows an execution in which a depression VT is provided in the upper layer OS of the carrier substrate. The edges of the depression VT form the frame RA on which the chip CH rests. The frame is thereby on the same level as the remaining surface of the upper layer OS. The height h2 of the depression VT determines the distance of the chip surface from the carrier substrate or, respectively, from the upper layer in the depression VT.

FIG. 2C shows an arrangement in which the chip lies over the entire upper layer OS of the carrier substrate. In this embodiment, the component structures BS (not shown in the Figure) are preferably protected by a passivation layer that is sufficiently mechanically stable or, respectively, sufficiently hard. Such a passivation layer can, for example, constitute an anodic oxide layer on component structures (typically comprised of aluminum). This passivation can additionally be covered by an $SiO_2$ layer on an $Si_3N_4$ layer. This execution is characterized by particularly simple production capability since the production of the frame or a depression can be foregone.

Figure 3:
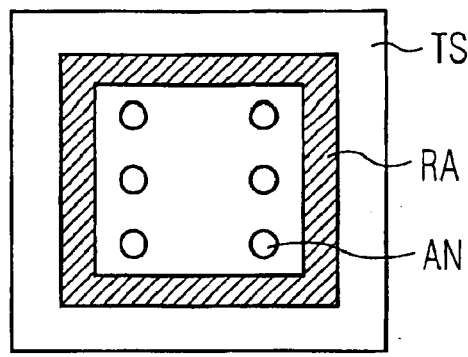
FIG. 3 shows a carrier substrate before the attachment of the chip.

FIG. 3 shows in schematic plan view the surface geometric of the carrier substrate TS before the application of the chip CH. The frame RA preferably follows the outer shape of the chip CH and is therefore in particular fashioned rectangular. As necessary, canted chip edges lead to a correspondingly varied shape of the frame RA. Within the frame, recesses AN are shown in which are arranged the bumps BU for soldering and contacting of the chip CH.

Figure 4:
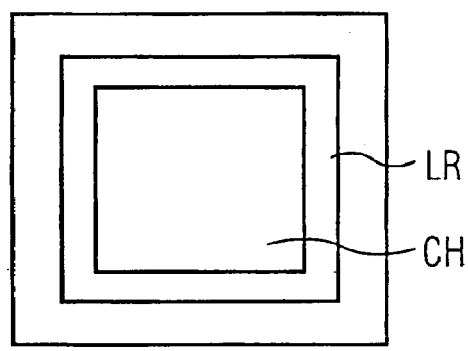
FIG. 4 shows the carrier substrate with attached chip and solder border.

FIG. 4 shows in schematic plan view an embodiment of the component after the application of the chip CH and the solder border LR. From the Figure, it is clear that the solder border LR completely encloses the chip CH and thus represents a good seal of the component structures and, as the case may be, any existing hollow space between the chip and carrier substrate.

Figure 5A:
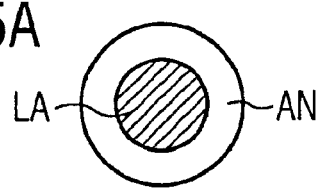
FIGS. 5A, 5B and 5C show various embodiments of recesses with solderable connection areas.
Figure 5B:
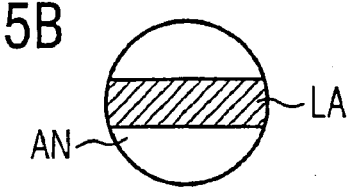
Figure 5C:
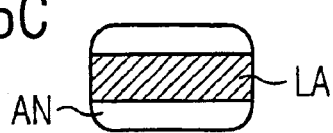

FIGS. 5A–5C show, in schematic plan view, various embodiments how the solderable connection areas LA can be structured in the recesses AN and relative to the border or walls of the recesses. In FIG. 5A, the circular recess AN receives a circular shape connection area LA.

FIG. 5B shows an arrangement in which the base of the solderable connection areas LA is not round, but rather is, for example, rectangular. Such a shape can, for example, be achieved when a conductor trace LB arranged on the surface of the lower layer is uncovered in the recesses AN.

FIG. 5C likewise shows a rectangular solderable connection area LA that, in contrast to FIGS. 5A and 5B, is however arranged in a likewise rectangular recess AN. The recesses can also exhibit other cross-sectional shapes and, for example, be oval.

Figure 6A:
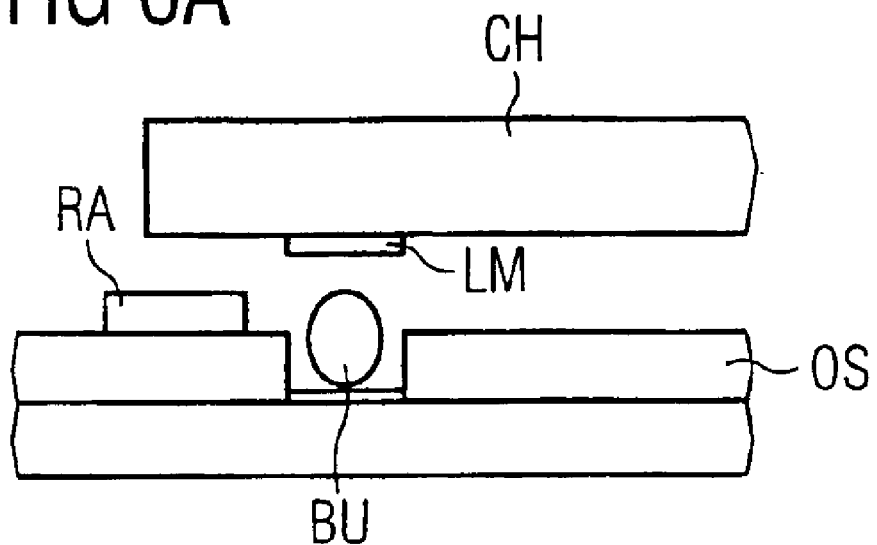
FIGS. 6A, 6B and 6C show various method steps during the attachment of the chip on the carrier substrate in schematic cross-section.
Figure 6B:
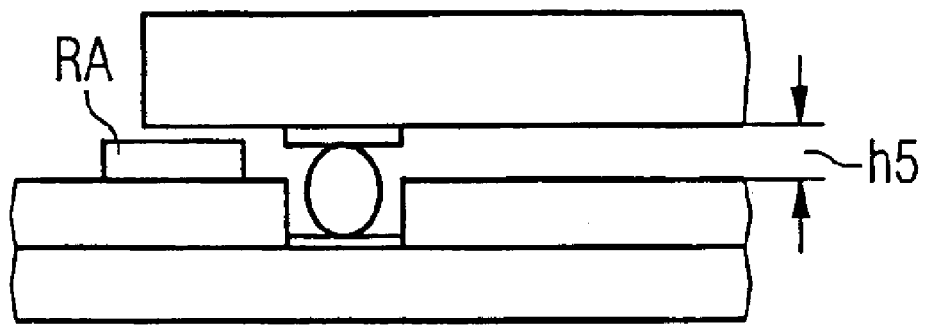
Figure 6C:
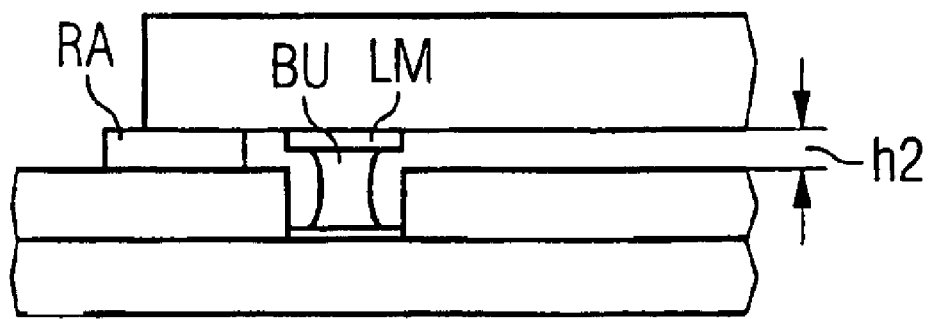

In FIGS. 6A–6C, the steps, using schematic cross-sections, show how the soldering of the chip onto the carrier substrate TS occurs. The variant is shown in which the bumps are generated in the recesses of the upper layer before the soldering. For this, the bump BU is wetted as necessary with a flux before the chip CH is attached, such that the solderable metallizations LM on the surface of the chip come in contact with the bump BU and attaches to this, as is shown in FIG. 6B. The attachment can thereby ensue with a high precision that has a standard deviation of only a few μm. FIG. 6B also clearly shows that the bump protrudes out over the level of the frame RA, such that after the placement on bump the chip exhibits a height h5 from the substrate that is larger than the height of the frame h2.

The soldering is, for example, implemented by means of a reflow process. It thereby leads to a softening of the bump BU that thereupon wets both with the solderable connection areas LA and with the solderable metallizations LM on the surface of the chip, and with these enters into a firm connection. It thereby leads to a cross-section enlargement as a result of which the height of the bump is reduced, and thereby the chip is pulled down and attaches to the frame RA. In this position, a secure fixing of the chip is ensured via the large application surface provided by the frame RA, and a constant distance h2 from the carrier substrate is set. The extent of the contraction of the bump is determined by the ratio of the areas of the corresponding under-bump metallizations UBM (here the solderable connection area LA and the solderable metallization LM) to the volumes of the bump. The larger the UBM relative to the mass of the bump, the greater the extent of the contraction. However, this ratio is preferably set such that the contraction suffices to be even with the attachment of the chip on the carrier substrate or, respectively, on the frame. Thus after the soldering minimal tensile loads act on the solder locations or, respectively, on the bumps.

Figure 7:
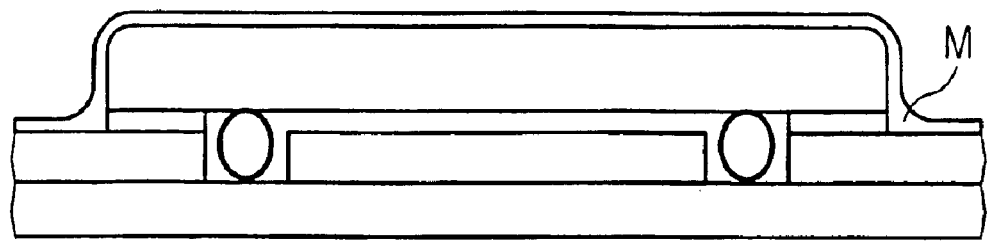
FIG. 7 shows, in schematic cross-section, a further metallization for the connection of the solder border.

FIG. 7 shows the component after the next step, in which a thin metallization M has been applied to the entire surface of the substrate and chip from the back, for example via sputtering. This layer preferably has the same composition as the UBM. The layer in particular serves for better wetting of the surfaces with the solder border LR that is applied in the next step. This metallization M can be reinforced galvanically or without current, for example with Cu and/or Ni or Pt, and subsequently provided further with a thin Au layer.

Figure 8:
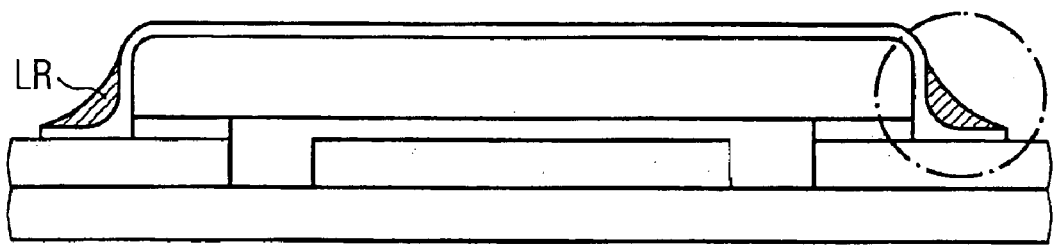
FIG. 8 shows, in schematic cross-section, the solder border applied to the metallization of FIG. 7.

FIG. 8 shows the component after the application of the solder border LR that forms a good hermetic seal to the metallization M.

In a further embodiment of the invention, after the application of the solder border LR, the chip can be thinned, for example in that the entire arrangement is exposed to a particle stream in a beam method. The surface is thereby irradiated with fine, correspondingly hard particles of a material, for example aluminum oxide particles or quartz particles. The harder the surface under the particle stream, the stronger the material stripping effected with the particle stream. In reverse, a soft surface coating can serve as a mask and protection from the particle stream and prevent removal of the materials at these locations. A metallization such as, for example, the solder border can also be removed for structuring. If, for example, the metallization generated in FIG. 7 via a suitable method after the application of the solder border is removed again from around said solder border, and subsequently a beam method is used over the entire surface, it leads both to a thinning of the chip CH and to a thinning of the substrate outside of the solder border LR that hereby serves as a mask. In this thinning method, the thickness of the wafer that was previously, for example, approximately 250 μm can ultimately be thinned to a thickness of 50 to 100 μm or less. This thinning is inventively particularly simply possible since the chip lies on the border or, respectively, on the carrier substrate without voltage, such that on the one hand it is exposed to no overly high mechanical stress via the beam method, and on the other hand it is stabilized sufficient securely after the thinning via the carrier substrate or, respectively, the frame RA. The beam method can also be implemented such that it leads to a transection of the carrier substrate TS around the solder border, whereby the individual components arranged on a common carrier substrate are isolated. Naturally it is also possible to provide a correspondingly soft structure resist mask before the isolation of the components, and with this to cover the chip in order to protect it as necessary from too strong a thinning.

Figure 9:
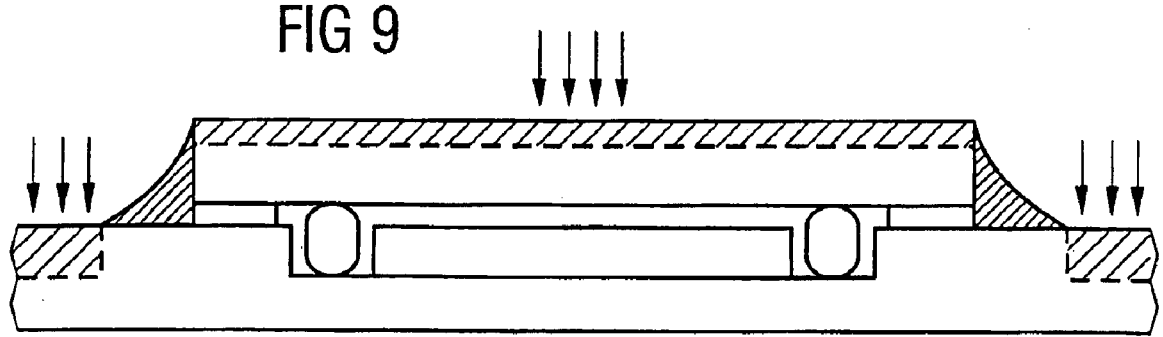
FIG. 9 shows, in schematic cross-section, how, with a beam method, both the layer thickness of the chip and that of the carrier substrate reduced in the area between the chip.

In FIG. 9, the regions to be stripped by the beam method are shown hatched.

Figure 11:
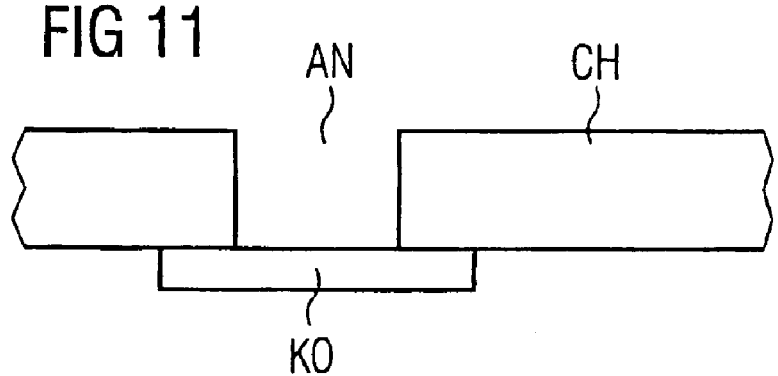
FIG. 11 shows, in schematic cross-section, an execution of the invention with a single-layer carrier substrate.

FIG. 11 shows an execution of the invention with an only single-layer carrier substrate. A solder pad can thereby first be generated on the underside of the carrier substrate for an SMD contact KO at a location over which the recess AN is provided. This can then be generated via material stripping from above, for example via laser or via a particle beam method. If a laser is used, the SMD contact KO can thus be provided with a mirror layer as a laser stop layer, for example with a thin gold layer. The SMD contact KO uncovered in the recess AN then serves as a connection area AF on which the bump BU is situated and on which it is soldered. The single-layer carrier substrate TS can thereby be produced both from ceramic and from circuit board material. The SMD contacts KO can then correspondingly be comprised of, as the case may be, silk screen printing paste reinforced galvanically or without current or, respectively, in the second case from copper. Thicknesses of approximately 20–35 μm are thereby sufficient for the mechanical function of the contact KO.

In the following, individual method steps are explained in further detail.

Production of a ceramic carrier substrate

The multi-layer carrier substrate TS is produced from ceramic green films that are printed with the necessary metallizations that later should lie between the individual layers of the multi-layer substrate. For example, a paste containing Ag/Pd is suitable for this. The openings (vias) for the feedthroughs and the recesses AN for acceptance of the bumps BU can already be generated in the green films, for example via stamping. The green films provided with electrode patterns are subsequently laminated and sintered. In one embodiment, it is possible to seal the vias already introduced into the green film with a filling material that can be removed again after the sintering. For this, the following method combinations are possible:

a) filling of the vias with aluminum oxide and removal of the aluminum oxide after the sintering with a beam process b) filling of the vias with lead oxide PbO and removal of the lead oxide via dissolution with acetic acid after the sintering c) filling of the vias with carbon-containing materials and removal of these materials or their remaining residues after the sintering via dissolution with acetic acid.

After the sintering, the outer metallizations, conductor traces and contact areas/contacts are also generated, for example via imprinting of a conductive paste that can subsequently be reinforced without current or galvanically. For reinforcement, the metals nickel and/or copper and/or platinum can be deposited and are preferably coated with a thin gold layer for better wetting capability with solder.

Production of the metallizations on the chip

A chip CH, which is already provided with component structures BS, has preformed all necessary metallizations, including solderable metallizations and ground assignments, from the material of which the component structures BS are also formed. This is in particular aluminum, an alloy comprising aluminum, or multi-layer design comprising aluminum and copper layers. To produce the solderable metallizations LM on the chip, the preformed structure is reinforced at the location provided for this, and in addition a photoresist mask is first applied and structured. The solderable metallizations LM are subsequently applied in the form of a layer configuration Ti/Pt/Au, for example via sputtering or vapor deposition. The overall configuration of the solderable metallizations LM subsequently exhibits a layer thickness of, for example, 400 nm, which is in the same range as the aluminum-comprising metallization lying thereunder for the component structures.

In a variant of the method, the photoresist mask is structured such that the mask remains on the areas provided for the solderable metallizations. The metallization regions not covered by the mask, in particular the component structures, are subsequently subjected to a passivation, for example an anodic oxidation. After removal of the mask, the solderable metallizations LM can be selectively, galvanically generated in a simple manner on the uncovered metallic areas, since the passivated surfaces of the component structures exhibit no conductivity.

Instead of the metallization sequence titanium/platinum/gold for the solderable metallizations, titanium/copper/gold or titanium/nickel/gold can also be deposited. Individual layers can thereby be generated both galvanically and without current, while thin layers are preferably sputtered.

In an advantageous embodiment, the bonding of the bumps to the solderable metallizations is improved via one of the following steps a or b:
  a) roughening of the chip surface in the region of the solderable metallizations before the application of the metallizations
  b) structured application of the metallizations such that an open band-like, grid-like or sieve-like structure of the solderable metallizations is created, in whose openings the chip is uncovered.

The roughening of the chip surface can be implemented with a beam process in which sensitive structures such as the component structures can be protected with a resist mask, a lacquer or a film.

The structured application of the metallizations can ensue together with the definition of the component structures that, for example, ensues with stripping technique. It is also possible to subsequently generate the openings via structured material removal in a metallization which was first applied over a large-area.

Production of a frame

The frame RA, which is provided in one part of the exemplary embodiments and guarantees the chip separation h2 from the carrier, can either be applied to the surface of the chip CH or also to the surface of the upper layer OS of the carrier substrate TS. While a frame applied to the chip is preferably fashioned as a plastic frame, a frame fashioned on the carrier substrate is preferably realized in the form of a metallization or a silk screen printing paste, which can be electrically conductive. For this metallization on the carrier substrate, in particular, the cited metal layer sequences suitable for the solderable connection metallizations are preferred. Copper can be applied in a thickness of approximately 1 to 2 $\mu$m without current over a thin titanium layer.

It is also possible to galvanically reinforce the copper layer, for example with an additional 10 to 20 $\mu$m-thick copper layer and/or a middle layer up to 10 $\mu$m thick.

In its external dimensions, the frame follows the outer chip edge and can inwardly exhibit a structuring in order to contact open areas on the piezoelectric substrate of the chip, or in order to contact ground assignments present on the open areas with the frame.

A frame comprised of plastic on the chip can be generated from a photoresist or be structured from another layer with the aid of photolithography.

Production of the solderable connection areas

The solderable connection areas LA are produced on the floor of the recesses in the upper layer OS. The base metallization can be a conductor trace imprinted by means of silver/palladium paste or, respectively, a wiring structure between the upper and lower layer, or alternatively can be formed from the upper termination of a feedthrough DK through the lower layer US. The feedthrough DK is typically likewise sealed with silver/palladium paste. After the uncovering of the metallization in the recesses, the solderable connection areas LA are then produced via galvanic or currentless reinforcement with copper/gold layers or with nickel/gold layers. The reinforcement of the metallization can ensue through the recesses AN.

Production of the bumps

The bumps can be generated in the recesses of the upper layer OS, whereby the following method steps are suitable:
  a) Galvanic deposition of SnPb, SnAg, SnCu, SnAgCu, SnAu and subsequent remelting, whereby the corresponding alloys are created.
  b) Via silk screen or stencil printing of solder paste and a subsequent reflow process to remelt the solder.
  c) Via utilization of the recesses as templates that, via scraping of solder paste, can be filled with solder which is subsequently remelted in a reflow process.
  d) Via vibration of solder balls of suitable size and subsequent reflow process. The solder balls are thereby dimensioned such that the remelted solder balls sink to the floor of the recess A-N and can contact the connection area located there.
  e) Via laser bumping
  f) Via directed stamping of cylinders from solder foil directly over the recesses.

Alternatively, the bumps can be generated on the chip CH, whereby the following method steps are suitable:
  a) Galvanic deposition of the solder masses cited above and subsequent remelting
  b) Via stencil printing of solder depots on the solderable metallizations LM and subsequent remelting. The electrode passivation of the remaining metallizations (component structures) can thereby serve as a solder stop mask.
  c) Via laser bumping Attachment of the chip to the carrier substrate Depending on the arrangement of the bump on the chip or carrier substrate, the chip is attached to the carrier substrate such that the bumps are arranged in the recesses. Alternatively, the chip is attached to the bumps located in the recesses such that said bumps can come in contact with the solderable metallizations. The ratio of the bump volumes to the area of the UBM (solderable metallizations LM and/or recesses AN) is thereby set such that the soldering leads to a contraction of the bump that is sufficient to achieve the placement of the chip on the carrier substrate or, respectively, the frame. After the placement on the carrier substrate or the frame, the chip is stabilized such that the stress of the bumps as a result of different thermal expansion of chip, bump and carrier substrate is essentially slight and the bump diameter can be reduced without impairing the stability of the soldering and of the component. The thickness of the frame and the thickness of the upper layer OS are likewise preferably attuned to one another such that both layers together yield a thermal expansion factor behavior which is approximately equal to the expansion behavior of the bump. Furthermore, a damaging additional stress of the bump is prevented in this manner.

Application of a solder border

After the soldering of the chip to the carrier substrate, a metallization is applied over the entire surface of the back side of the chip and on the surface of the carrier substrate, for example via sputtering. In particular titanium in a thickness of 100 to 200 nm is suitable for this. This layer can subsequently be reinforced with copper and/or nickel at a thickness of approximately 2 to 20 µm. As an oxidation-resistant surface layer that can also be wetted well with solder, a thin gold layer can also be applied here as a termination layer, for example via vapor deposition or sputtering. This metallization can subsequently be structured such that it remains only at those locations at which the solder border should apply.

A solder border is subsequently generated. This can, for example, ensue in that solder powder is scattered over the entire surface and a reflow process is subsequently implemented. Via formation of molten solder, this ultimately accumulates at the locations where it is wetted with the surface, thus at the surface regions provided with a bare metal layer. It is also possible, for example, to stamp out a border-shaped piece of solder foil and to lay it around or over the chip. It is also possible to stamp solder foil pieces with a size corresponding to the entire area enclosed by the solder border and to arrange it over the chip.

Here as well a reflow process leads to the solder being concentrated in the regions covered by bare metal surfaces. Via corresponding structuring of these regions before the application of the solder border by means of a photoresist technique, the regions of the metallization to be wetted can be limited to a narrow band along the chip edge and band-shaped regions of the surface of the carrier substrate adjacent to said chip edge.

Figure 10:
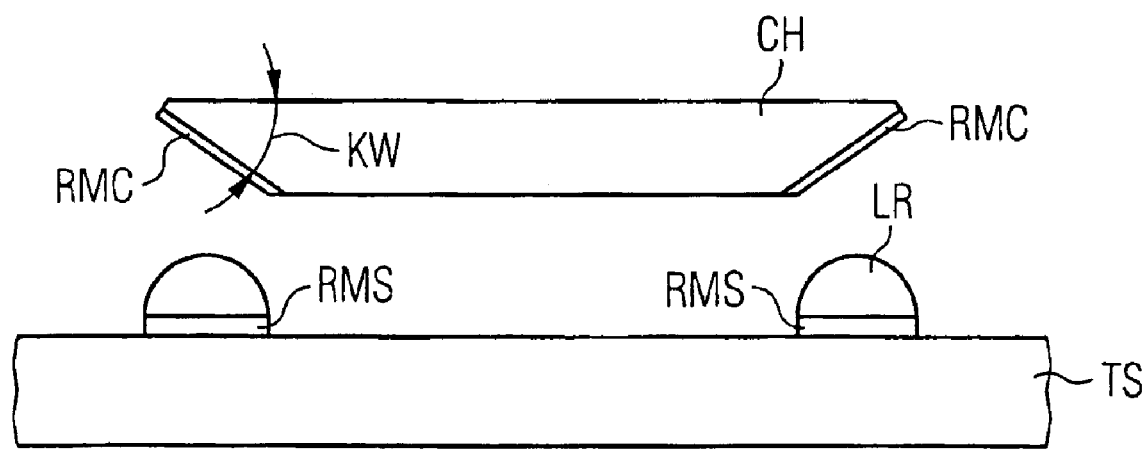
FIG. 10 shows, in schematic cross-section, how a chip with canted edges is attached directly to the solder border.

FIG. 10 shows an alternative embodiment of the invention. The solder border LR is thereby generated on the carrier substrate before the attachment of the chip CH. For this, a metallization RMS similar to an under-bump metallization (UBM) on the carrier substrate is first generated at the locations provided for the solder border. The solder border can then be applied via imprinting, galvanic reinforcement of the UBM or likewise as a border-shaped piece of solder foil. In this embodiment, the side edges of the chip are canted such that the chip tapers towards the surface with the component structures. At the side edges it is then preferably provided with metallizations RMC together with the solderable metallizations LM (or, respectively, UBM), for example via sputtering. A preferable edge angle KW on the chip edge is thereby less than 45°, since then the metallizations RMS can be generated on the chip together with the UBMs.

The chip can then be attached to the carrier substrate such that it is arranged with the canted side edges over the solder border LR, and upon soldering simultaneously enters a solder joint with the metallizations RMC on the side edges of the chip.

Thinning of the chip on the ceramic

After the soldering, the chips can be thinned in order to achieve a still overall lower overall height. The chip (piezoelectric crystal) exhibiting a high thickness of approximately 250 µm, which is unnecessary for the component function due to the manageability, can thereby be thinned to a thickness of 50 to 100 µm. For thinning, in particular a particle beam is suitable with aluminum oxide particles of a diameter <50 µm. It is also possible to grind the chip. The secure placement of the chip on the frame or the carrier substrate thereby guarantees that no damage to the chip ensues during the thinning, since it is sufficiently stabilized by the frame. Before the processing with a particle beam, the regions in which a removal should be prevented can be covered by means of a soft resist mask, for example a photoresist mask. However, it is also possible to remove regions of the carrier substrate simultaneously with the thinning of the chip, or to completely divide said carrier substrate by means of the beam method. In this case, it can be necessary to likewise cover the chip beforehand with a mask.

Since the invention could only be shown using a few exemplary embodiments, it is not limited to these. Further variants of the inventive component or of the method for its production in particular form other geometric embodiments, other materials to be used, or can be achieved via use of analogous processes with which the same effects can be achieved. However, the arrangement of the bumps, with which the inventively low component height connected with simpler and better sealing capability of the component can be achieved, always remains in the recesses of the carrier substrate.

With the inventive method, a plurality of chips can preferably be applied, connected and encapsulated in parallel on a corresponding large-area carrier substrate. The carrier substrate can subsequently be divided between individual chips in order to isolate individual components or groups of components circuited with one another into modules. The division and isolation can ensue with a beam process or via sawing. Surface layers and in particular metallizations to be divided can thereby, as necessary, be wet-chemically structured or removed via plasma etching beforehand.

We claim:

1. A component comprising a chip having component structures, said chip comprising, on one surface, solderable metallizations connected with the component structures, a carrier substrate having, on a lower surface, contacts for electrically conductive connection with the component structures of the chip, conductor traces extending from the contact to connection areas, wherein the connection areas are respectively at least partially uncovered on a floor of recesses in the carrier substrate, said chip being mounted in a flip-chip arrangement by means of bump connections arranged in the recesses, said bump connections electrically-conductively connecting the solderable metallizations of the chip to the connection areas of the carrier substrate, so that the chip at least partially rests on the carrier substrate, the chip, on a back side, having a lacquer layer selectively removed to generate an inscription for the chip.

2. A component according to claim 1, wherein additional layers forming an optical contrast with the lacquer layer are provided under the lacquer layer of the chip.

3. A component comprising a chip having component structures and outer edges, said chip comprising, on one surface, solderable metallizations connected with the component structures, a carrier substrate having, on a lower surface, contacts for electrically conductive connection with the component structures of the chip, conductor traces extending from the contact to connection areas, wherein the connection areas are respectively at least partially uncovered on a floor of recesses in the carrier substrate, said chip being mounted in a flip-chip arrangement by means of bump connections arranged in the recesses, said bump connections electrically-conductively connecting the solderable metallizations of the chip to the connection areas of the carrier substrate, so that the chip at least partially rests on the carrier substrate, the outer edges of the chip being canted and taper toward the carrier substrate.

4. A method for producing an encapsulated component, said method comprising the steps of providing a multi-layer carrier substrate which comprises recesses of a depth h1 having bottoms uncovering solderable connection areas, providing a chip having component structures of a height h3 on one surface as well as solderable metallizations connected with said component structures, generating a depression having a depth h2 for acceptance of the component structure on one of the surface of the chip and the carrier structure, creating solder bumps on one of the solderable connection areas and solderable metallizations having a height h4, whereby h4>(h1+h2), attaching the chip to the carrier substrate with a flip-chip arrangement by melting the soldered bumps so that the solder connection areas are connected via the solder bumps with the solderable metallization and upon a mutual shrinking of the solder bumps conditional upon melting, the height h4 of the solder bumps drops to (h1+h2) and said chip drops on the carrier substrate and rests there, whereby the component structures are arranged in a hollow of the height h2 formed by the depression and are covered by the chip and carrier substrate.

5. A method according to claim 4, wherein the first contact metallizations are created on the carrier substrate in the region below the lower chip edge, the second contact metallizations being generated on the chip in the region between the contact barrier and the facing chip area, and a solder border circling the chip being created for connection of the first and second contact metallizations.

6. A method according to claim 4, wherein the chip narrowing toward the surface with the contact structures with canted side edges is used, the solder border being generated on the carrier substrate before the attachment of the chip in that soldering the side edges of the chip are attached with the metallizations located there to the solder borders and are soldered therewith.

7. A method according to claim 4, wherein the step of creating the solder bumps generates the solder bumps on a solderable metallization of the chip and the solderable connection areas of the carrier substrate by a method selected from a group consisting of galvanic deposition, silk screen, stencil printing, scraping of solder paste into recesses of the carrier substrate, vibration of solder balls into the recesses of the carrier substrate, laser bumping and stamping of solder foil over the recesses.

8. A method according to claim 4, wherein the carrier substrate is a multiple carrier substrate having at least an upper layer and a lower layer, the recesses are created in the upper layer and filled with conductive material, the solderable connecting areas being a solder coating on a surface of the lower layer facing the upper layer under the recesses of the upper layer.

9. A method according to claim 8, wherein the base of the recesses is selected larger in the upper layer than the area of the solderable connection areas on the surface of the lower layer in that the cross-section of the bumps is selected smaller than those of the recesses.

10. A method according to claim 4, wherein, after the step of soldering and generating the solder border, material is removed from the back side of the chip by a method selected from particle beam removal and abrasion, so that the chip is thinned.

11. A method according to claim 4, wherein the chips are being applied to a large-area carrier substrate and are first subsequently isolated into components or modules via a division of the carrier substrate between the chips.

12. A method according to claim 11, wherein the isolation occurs via a beam method in which the solder border serves as a mask.

13. A method according to claim 4, wherein the step of providing the multi-layer carrier substrate provides a multi-layer of green ceramic, forming recesses in the upper layer of the multi-layer green ceramic, filling the recesses with a filling material and then sintering the multi-layer green ceramic to form multi-layer sintered ceramics and then removing the filling material after sintering.

14. A method according to claim 13, wherein the step of filling the recesses and removal of the filling material again is selected from a group consisting of filling with $Al_2O_3$ and removing the $Al_2O_3$ with a beam process; filling with a PbO and removing the PbO via dissolution with an acetic acid and filling with a carbon-containing material and removing the carbon-containing material via dissolving with acetic acid.

15. A method according to claim 4, wherein the step of bonding the bumps to the solderable metallizations is improved by following a step selected from roughening the chip surface before the application of the metallizations in the region of the solderable metallizations and structured application of the metallizations so that an open band-like, grid-like or sieve-like structure of the solderable metallizations is created, in whose openings the chip is uncovered.

16. A component comprising a chip having, on its surface, component structures and solderable metallizations electrically connected to the component structures; a carrier substrate having, on its bottom surface, contacts to provide an electrical connection to the component structures of the chip, said carrier substrate having contact areas and conductor traces extending from the contacts to the contact areas, said carrier substrate having a frame which encloses a depression of said carrier substrate, said depression having a floor with recesses being arranged on the floor of said depression, said recesses having bottoms at least partially uncovering the contact areas, said chip being mounted on the carrier substrate in a flip-chip arrangement by means of bumps arranged in the recesses, said bumps electrically connecting the solderable metallizations of the chip to the connection areas of the carrier substrate, said frame supporting said chip.

17. A component according to claim 16, wherein the carrier substrate comprises a lower layer and an upper layer arranged on top of the lower layer, said connection areas are arranged on the surface of the lower layer, said recesses are formed by through-holes provided in said upper layer to uncover said connection areas.

18. A component according to claim 17, wherein said frame is arranged on top of the upper layer.

19. A component according to claim 16, wherein the contact area between said carrier substrate and said chip is circumferentially sealed with a closed solder boarder.

20. A component according to claim 19, wherein the frame is fashioned as a metallization on the surface of the carrier substrate and is arranged circumferentially along and underneath the chip edge facing the carrier substrate and in that the boundary surface between the frame and chip is circumferentially sealed with a closed solder border.

21. A component according to claim 16, wherein a first recess is provided in an upper layer of the carrier substrate in order to form said frame.

22. A component according to claim 16, wherein the chip is fashioned on a piezoelectric substrate to form a component selected from a group consisting of SAW components, FBAR resonator, BAW resonator and SCF filter.

23. A component according to claim 16, wherein the frame is formed from a material selected from plastic or metallization on one of the surfaces of the chip and carrier substrate or is the boundary of a depression provided on the surface of the carrier substrate, said depression having a depth which corresponds at least to the height of the component structure arranged in the hollow.

24. A component according to claim 16, wherein the carrier substrate is a multi-layer carrier substrate having at least two layers with a lower layer being provided with feedthroughs that are filled with a conductive material, the surface of the feedthroughs forming the connection area of the substrate.

25. A component according to claim 16, wherein the carrier substrate is a low-warpage LTCC ceramic.

26. A component according to claim 16, wherein the carrier substrate is a multi-layer substrate having at least two layers, said metallized contacts being provided on the underside of a lower layer of the multi-layer carrier substrate and being connected by feedthroughs with the wiring arranged between the two layers of the at least two-layer carrier substrate, with the wirings being selected as the connection areas or being connected to the connection areas.

27. A component according to claim 16, wherein the chip is metallized at least in the region of its lower edge and the carrier substrate is metallized at least on a band below the lower edge of the chip, whereby the metallization comprises at least one of the metals selected from a group consisting of Al, Ni, Cu, Pt and Au.

28. A component comprising a chip having, on a first surface, component structures and solderable metallizations electrically connected to the component structures, a carrier substrate comprising, on its bottom side, contacts to provide an electrical connection to the component structures of the chip, said carrier substrate further comprising contact areas and conductor traces extending from the contacts to the contact areas, said contact areas being at least partially uncovered, said carrier substrate further comprising recesses, wherein said contact areas are arranged on a floor of said recesses, wherein one of said chip and said carrier substrate is provided with a frame so that a part of said component structures is arranged in a hollow that is enclosed by said frame, chip surface and the surface of the carrier substrate facing the chip, wherein said chip is mounted on the carrier substrate in a flip-chip arrangement by means of bumps arranged in the recesses, said bumps electrically connecting the solderable metallizations of the chip to the connection areas of the carrier substrate, wherein said frame supports said chip.

29. A component comprising a chip having, on a first surface, component structures and solderable metallizations electrically connected to the component structures, a carrier substrate comprising, on its bottom side, contacts to provide an electrical connection to the component structures of the chip, said carrier substrate further comprising contact areas and conductor traces extending from the contacts to the contact areas, said contact areas being at least partially uncovered, said carrier substrate further comprising recesses, wherein said contact areas are arranged on a floor of said recesses, a frame being provided between said chip and said carrier substrate so that a part of said component structures is arranged in a hollow that is enclosed by said frame, chip surface and the surface of the carrier substrate facing the chip, said chip is mounted on the carrier substrate in a flip-chip arrangement by means of bumps arranged in the recesses, said bumps electrically connecting the solderable metallizations of the chip to the connection areas of the carrier substrate, wherein said frame supports said chip.

* * * * *

UNITED STATES PATENT AND TRADEMARK OFFICE
CERTIFICATE OF CORRECTION

PATENT NO.    : 6,982,380 B2
DATED         : January 3, 2006
INVENTOR(S)   : Christian Hoffmann, Jürgen Portmann and Hans Krueger It is certified that error appears in the above-identified patent and that said Letters Patent is hereby corrected as shown below:

Title page,
Item [54], Title, should read:
-- ENCAPSULATED COMPONENT WITH LOW OVERALL HEIGHT AND METHOD FOR PRODUCTION OF THE SAME --.

Signed and Sealed this

Seventh Day of March, 2006

JON W. DUDAS
*Director of the United States Patent and Trademark Office*